United States Patent
Heng et al.

(10) Patent No.: US 10,389,053 B2
(45) Date of Patent: Aug. 20, 2019

(54) CIRCUIT BOARD SOCKET WITH RAIL FRAME

(71) Applicants: Stephen F. Heng, Los Gatos, CA (US); Mahesh S. Hardikar, San Jose, CA (US); Sanjay Dandia, San Jose, CA (US)

(72) Inventors: Stephen F. Heng, Los Gatos, CA (US); Mahesh S. Hardikar, San Jose, CA (US); Sanjay Dandia, San Jose, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 10 days.

(21) Appl. No.: 15/274,628

(22) Filed: Sep. 23, 2016

(65) Prior Publication Data

US 2017/0104286 A1 Apr. 13, 2017

Related U.S. Application Data

(63) Continuation of application No. 14/877,647, filed on Oct. 7, 2015, now Pat. No. 9,466,900.

(51) Int. Cl.
*H05K 3/30* (2006.01)
*H01R 12/88* (2011.01)
(Continued)

(52) U.S. Cl.
CPC .......... *H01R 12/88* (2013.01); *H01R 12/7076* (2013.01); *H01R 43/205* (2013.01); *H05K 3/32* (2013.01); *H05K 7/1007* (2013.01)

(58) Field of Classification Search
CPC ................ H01L 23/001; H01L 23/147; H01L 23/49827; H01L 23/5384; H01L 24/81; H01L 24/97; H01L 25/0655; H05K 3/3494

See application file for complete search history.

(56) References Cited

U.S. PATENT DOCUMENTS

| 7,207,822 B2 | 4/2007 | Szu |
| 7,429,182 B1 * | 9/2008 | Zheng ................ H05K 7/1061 439/135 |

(Continued)

FOREIGN PATENT DOCUMENTS

| CN | 201041844 Y | 3/2008 |
| CN | 101752767 A | 6/2010 |

(Continued)

OTHER PUBLICATIONS

PCT/US2016/051977 International Search Report and Written Opinion dated Dec. 21, 2016.

(Continued)

*Primary Examiner* — Paul D Kim
(74) *Attorney, Agent, or Firm* — Timothy M. Honeycutt

(57) ABSTRACT

Various apparatus and methods of electrically connecting a packaged integrated circuit to a circuit board are disclosed. In one aspect, an apparatus includes a first frame to be mounted on the circuit board and having a first end. An insulating housing is adapted to be mounted on the circuit board and positioned in the first frame. A second frame is pivotally coupled to the first frame. The second frame includes two spaced-apart rail members and a cross member coupled to and between the rail members opposite the first end of the second frame. The rail members are operable to receive the packaged integrated circuit. The second frame has at least one engagement member to engage a first portion of the insulating housing when the second frame is pivoted toward the insulating housing. A third frame is pivotally coupled to the first frame to apply force to the packaged integrated circuit.

20 Claims, 12 Drawing Sheets

(51) Int. Cl.
*H05K 3/32* (2006.01)
*H05K 7/10* (2006.01)
*H01R 12/70* (2011.01)
*H01R 43/20* (2006.01)

(56) References Cited

U.S. PATENT DOCUMENTS

| | | | | |
|---|---|---|---|---|
| 7,438,580 | B1* | 10/2008 | Aoki | H05K 7/1061 |
| | | | | 439/331 |
| 7,686,636 | B2* | 3/2010 | Lin | H01R 12/88 |
| | | | | 439/266 |
| 7,749,014 | B2* | 7/2010 | Chiang | H01L 23/32 |
| | | | | 439/331 |
| 8,506,316 | B2 | 8/2013 | Tsai et al. | |
| 8,979,565 | B2 | 3/2015 | Yeh | |
| 8,979,566 | B2 | 3/2015 | Yeh | |
| 9,011,170 | B2* | 4/2015 | Sauer | H01R 12/88 |
| | | | | 439/331 |
| 9,192,070 | B2* | 11/2015 | Tan | H05K 7/10 |
| 2005/0233626 | A1 | 10/2005 | Toda et al. | |
| 2007/0072470 | A1 | 3/2007 | Toda et al. | |
| 2009/0203245 | A1 | 8/2009 | Chiang | |
| 2010/0015837 | A1 | 1/2010 | Zhang | |
| 2012/0156919 | A1 | 6/2012 | Yeh et al. | |
| 2013/0171858 | A1 | 7/2013 | Sauer et al. | |
| 2013/0183849 | A1 | 7/2013 | Tsai et al. | |
| 2013/0322037 | A1 | 12/2013 | Tan et al. | |
| 2013/0323964 | A1 | 12/2013 | Cheng et al. | |
| 2013/0344713 | A1 | 12/2013 | Yeh | |
| 2014/0011377 | A1 | 1/2014 | Yeh | |

FOREIGN PATENT DOCUMENTS

| | | |
|---|---|---|
| JP | 2005012491 | 1/2005 |
| JP | 2005302613 | 10/2005 |

OTHER PUBLICATIONS

PCT/US2016/051977 Korean Patent Application No. 10-2018-7010858 Korean Office Action dated Nov. 6, 2018.
EP Application No. EP 16854059 (PCT/US2016/051977) Supplementary European Search Report dated Apr. 10, 2019.

* cited by examiner

CIRCUIT BOARD SOCKET WITH RAIL FRAME

This application is a continuation of Ser. No. 14/877,647, filed Oct. 7, 2015, now U.S. Pat. No. 9,466,900.

BACKGROUND OF THE INVENTION

1. Field of the Invention

This invention relates generally to semiconductor processing, and more particularly to sockets useful with, for example, circuit boards, and to methods of making and using the same.

2. Description of the Related Art

In various types of electronic systems, microprocessors and sometimes other types of integrated circuits are often connected to some form of larger printed circuit board, such as a motherboard, daughterboard or other type of a printed circuit board. In some cases, the integrated circuit is connected to the motherboard by direct soldering or other direct mounting techniques. In other cases, a socket is provided on the upper surface of the motherboard that is designed to receive the integrated circuit. For those integrated circuits that consist of some type of package enclosure and some plurality of conductor pins or lands that project from the package, the motherboard socket includes a corresponding plurality of individual socket holes or flexible land contacts that are arranged spatially to match up with corresponding conductor pins or lands on the integrated circuit package. Conductive lands are used with a so-called land grid array (LGA) package. LGA sockets incorporate flexible LGA contacts.

In many conventional LGA socket designs, the integrated circuit socket consists of a fortress-like structure that has four walls interconnected at four corners. The four walls enclose an interior space that has a bottom surface provided with a plurality of the aforementioned individual LGA contacts. To bring the package interconnects into ohmic contact with the LGA contacts, some form of clamping mechanism is utilized. In one conventional design, the clamping mechanism consists of a spring loaded lid pivotally mounted to a frame that is in-turn secured to a circuit board. The packaged integrated circuit is first mounted to a detachable holder and the holder is then mounted to the spring loaded lid. The spring loaded lid leaves a space between the upper surface of the package lid and the under surface of the spring loaded lid. This space results in a requirement for a heat sink to use a pedestal in order to mount on the package lid. Levers are used to hold the spring-loaded lid in position.

Another conventional LGA socket clamping mechanism uses a holding member pivotally mounted on a stiffener that is in-turn mounted on a circuit board. A packaged integrated circuit is mounted on a carrier that is slidedly mounted on the holding member. The holding member is pivoted down into position relative to a socket housing by depressing a tab on the holding member that is laterally offset from hinge connecting the holding member to the stiffener. Thereafter a load plate is pivoted down into engagement with the package lid and both the load plate and the holding member are fixed by levers. The offset placement of the tab can introduce torques during the pivoting maneuver of the holding member, which might impact land to contact positioning.

The present invention is directed to overcoming or reducing the effects of one or more of the foregoing disadvantages.

SUMMARY OF THE INVENTION

In accordance with one aspect of the present invention, an apparatus for electrically connecting a packaged integrated circuit to a circuit board is provided. The apparatus includes a first frame adapted to be mounted on the circuit board and having a first end. An insulating housing is adapted to be mounted on the circuit board and positioned in the first frame. The insulating housing includes plural electrical contacts to electrically interface with the packaged integrated circuit. A second frame has a first end pivotally coupled to the first end of the first frame. The second frame includes two spaced-apart rail members and a cross member coupled to and between the rail members opposite the first end of the second frame. The rail members are operable to receive a carrier frame capable of holding the packaged integrated circuit. The second frame has at least one engagement member to engage a first portion of the insulating housing when the second frame is pivoted toward the insulating housing. A third frame has a first end pivotally coupled to the first end of the first frame and is operable to apply force to the packaged integrated circuit.

In accordance with another aspect of the present invention, an apparatus is provided that includes a circuit board and a first frame mounted on the circuit board and having a first end. An insulating housing is mounted on the circuit board and positioned in the first frame. The insulating housing includes plural electrical contacts to electrically interface a packaged integrated circuit. A second frame has a first end pivotally coupled to the first end of the first frame. The second frame includes two spaced-apart rail members and a cross member coupled to and between the rail members opposite the first end of the second frame. The rail members are operable to receive a carrier frame capable of holding the packaged integrated circuit. The second frame has at least one engagement member to engage a first portion of the insulating housing when the second frame is pivoted toward the insulating housing. A third frame has a first end pivotally coupled to the first end of the first frame and is operable to apply force to the packaged integrated circuit.

In accordance with another aspect of the present invention, a method of mounting a packaged integrated circuit on a circuit board is provided. The method includes placing the packaged integrated circuit on a carrier frame. The carrier frame and the packaged integrated circuit are placed on a first frame. The first frame has a first end pivotally coupled to a first end of a second frame that is coupled to the circuit board. The first frame includes two spaced-apart rail members and a cross member coupled to and between the rail members opposite the first end of the first frame. The rail members are operable to receive the carrier frame. The first frame has at least one engagement member to engage a first portion of an insulating housing mounted on the circuit board when the first frame is pivoted toward the insulating housing. The insulating housing including plural electrical contacts to electrically interface with the packaged integrated circuit. The first frame is pivoted toward the insulating housing until the at least one engagement member engages the first portion of the insulating housing. The packaged integrated circuit is clamped against the insulating housing by pivoting a third frame pivotally coupled to the first end of the second frame into engagement with the packaged integrated circuit.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

A socket to electrically interface a packaged integrated circuit with a circuit board is disclosed. The socket includes an insulating housing with plural electrical contacts to interface with corresponding interconnects of the packaged integrated circuit. The packaged integrated circuit may be placed on a carrier frame and the carrier frame placed on a rail frame. The rail frame is pivotally mounted on a stiffener frame coupled to the circuit board. The rail frame may be pivoted to bring the packaged integrated circuit down into proximity with the insulating housing. Thereafter, a force frame pivotally mounted on the stiffener frame may be pivoted to clamp the packaged integrated circuit in position. Additional details will now be disclosed.

Figure 1:
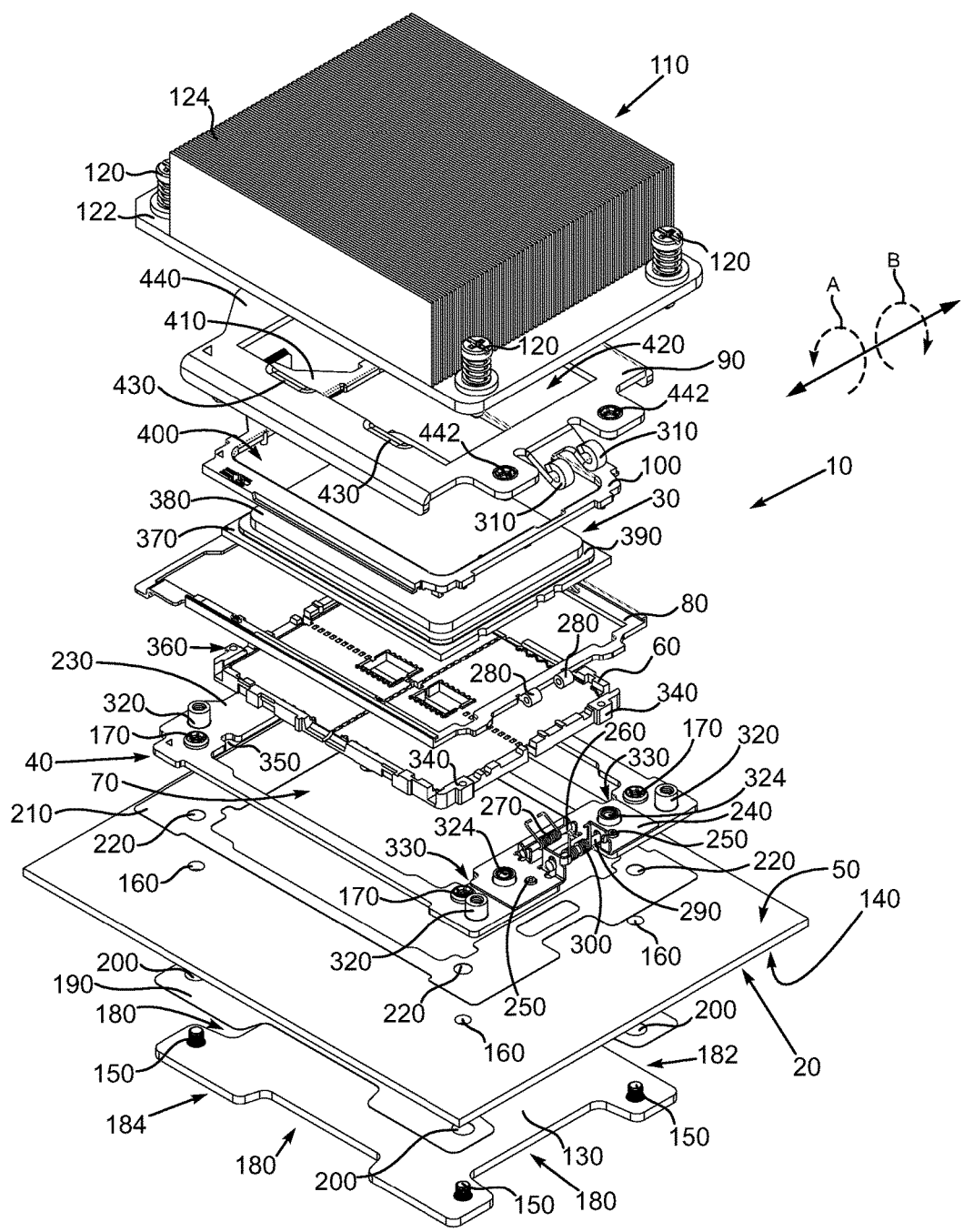
FIG. 1 is an exploded pictorial view of an exemplary embodiment of a socket that may be mounted to a circuit board.

In the drawings described below, reference numerals are generally repeated where identical elements appear in more than one figure. Turning now to the drawings, and in particular to FIG. 1, therein is depicted an exploded pictorial view of an exemplary embodiment of a circuit board socket 10 that may be mounted to a circuit board 20 and used to establish electrical connection between the circuit board 20 and a packaged integrated circuit 30. The socket 10 may include a stiffener frame 40 that is mounted to an upper surface 50 of the circuit board 20 and an insulating housing or socket housing 60 that is also mounted on the upper surface 50 of the circuit board 20 and positioned within an opening 70 of the stiffener frame 40. In addition, the socket 10 may include a rail frame 80 that is pivotally mounted to the stiffener frame 40 and a force frame 90 that is also pivotally mounted to the stiffener frame 40. The rail frame 80 and the force frame 90 may be pivoted in directions A and B. As described more fully below, the packaged integrated circuit 30 may be first mounted on a carrier frame 100. The carrier frame 100 may then be slidedly mounted on the rail frame 80 and the combination of the rail frame 80 and the carrier frame 100 rotated in direction A until the rail frame 80 engages a portion of the socket housing 60 to be described in more detail below. Thereafter, the force frame 90 may be similarly rotated in direction A and secured to the stiffener frame 40 to clamp the packaged integrated circuit 30 in position.

When the force frame 90 is rotated and locked into position, a heat sink 110 may be placed in thermal contact with the packaged integrated circuit 30 and secured to the circuit board 20 by way of fasteners 120. The fasteners 120, only three of which are visible in FIG. 1, but which may number three or more, may be spring-biased screws as shown or any of a variety of fasteners. The heat sink 110 may be constructed in a large variety of configurations. The illustrative embodiment of the heat sink 110 includes a base 122 designed to establish thermal contact with the packaged integrated circuit 30 and plural heat fins 124 connected or integrally formed with the base 122. The base 122 may have a planar underside. Other embodiments need not be planar. Heat pipes, fans and liquid cooling may be used with the heat sink 110. Well-known materials may be used for the heat sink 110, such as copper, aluminum, brass, stainless steel or the like.

The circuit board 20 may be a motherboard, a circuit card or virtually any other type of printed circuit board. Monolithic or buildup structures could be used for the circuit board 20. A buildup design may consist of a central core upon which one or more build-up layers are formed and below which an additional one or more build-up layers are formed. The core itself may consist of a stack of one or more layers. So-called "coreless" designs may be used as well. The layers of the circuit board 20 may consist of an insulating material, such as various well-known epoxies, interspersed with metal interconnects. A multi-layer configuration other than buildup could be used. Optionally, the circuit board 20 may be composed of well-known ceramics or other materials suitable for package substrates or other printed circuit boards. The circuit board 20 may be provided with a number of conductor traces and vias and other structures (not visible) in order to provide power, ground and signals transfers between the socket 10 and another device. Note the circuit board 20 may be larger and have other footprints than what is depicted.

The stiffener frame 40 is designed to provide a strong mounting structure to hold the various pivoting structures, such as the rail frame 80 and the force frame 90, in position before, during and after the mounting of the packaged integrated circuit 30. The stiffener frame 40 may be mounted to the upper surface 50 of the circuit board 20 and held in position by way of a back plate 130, which is positioned against a back side 140 of the circuit board 20. The back plate 130 may include multiple fasteners 150, only three of which are visible in FIG. 1 but which may number three or more. The fasteners 150 may be mounting screws or other types that are operable to project through respective bores 160 in the circuit board 20 and ultimately thread into threaded holes 170 of the stiffener frame 40. The threaded holes 170 could be fabricated as the depicted threaded nuts or other structures, be fixed or rotatable, or even be constructed by cutting threads into holes in the stiffener frame 40. The back plate 130 may have any of a great variety of different types of footprints, such as rectangular, square, irregular, etc. Here, the back plate 130 has a generally rectangular footprint, albeit with four cut-outs 180, again only three of which are visible in FIG. 1. For example, a side 182 of the back plate 130 may be mirror image of the opposite side 184. Protection against electrical shorts may be provided by positioning an optional back plate insulator 190 between the back surface 140 of the circuit board and the back plate 130. The back plate insulator 190 may have the same or a different footprint as the back plate 130. To facilitate the mounting screws 150 of the back plate 130, the back plate insulator 190 may have corresponding through holes 200, three of which are shown and one of which is not visible. The back plate 130 may be constructed of stainless steel, copper, aluminum, nickel or other materials. Similarly, a front plate insulator 210 may be positioned between the stiffener frame 40 and the upper surface 50 of the circuit board 20 and fabricated with through holes 220 (three of the four of these are visible) to accommodate the mounting screws 150 of the back plate 130. The back plate insulator 190 and the front plate insulator 210 may be constructed of the same types of materials disclosed elsewhere herein for the socket housing 60.

Still referring to FIG. 1, the stiffener frame 40 may include a frame portion 230 and a support plate 240 mounted on the frame portion 230. Both the frame portion 230 and the support plate 240 may be composed of stainless steel, copper, aluminum, nickel or other materials. The support plate 240 may be mounted to the frame portion 230 by rivets 250, which may number two or more as shown, or screws or other fastening techniques as desired. The support plate 240 includes a pivotally-mounted hinge pin 260 and a spring 270. The rail frame 80 includes two or more knuckles 280, which are designed to be journalled by the hinge pin 260 so that the rail frame 80 is spring-biased in direction B by way of the spring 270. The support plate 240 similarly includes another hinge pin 290 and a spring 300. The force frame 90 includes two or more knuckles 310, which are pivotally engaged with the hinge pin 290 such that the spring 300 biases the force frame 90 in direction B. The stiffener frame 40 may include three or more upwardly projecting threaded nuts 320, which are designed to threadedly receive the spring loaded mounting screws 120 of the heat sink 110. Note that one of the nuts 320 is not visible in FIG. 1. In addition, the stiffener frame 40 may include upwardly projecting mounting hardware in the form of threaded nuts 324 or otherwise positioned on opposite sides of the springs 270 and 300 (and a third threaded nut obscured by the socket housing 60). The threaded nuts 324 may number more than three, be configured like the threaded holes 170 described above, and are provided to engage fasteners of the force frame 90 to be described below. The opening 70 of the stiffener frame 40 includes a pair of notches 330 at one end that are designed to engage respective keys 340 of the socket housing 60. The opening 70 similarly includes oppositely-positioned notches 350, only one of which is visible, that are designed to engage respective keys 360, again only one of which is visible, of the socket housing 60.

The packaged integrated circuit 30 includes a substrate or circuit board 370, one or more integrated circuit die (not visible) positioned on the circuit board 370 and a lid 380 positioned over the die(s) to serve as a heat spreader. The base 122 of the heat sink 110 may be seated on the lid 380 with or without a thermal interface material, such as a thermal grease or other. The circuit board 370 may be an organic or ceramic design and multi-level as desired. To interface electrically with the socket housing 60, the circuit board 370 may include plural electrical interconnects (not visible, but shown in later figures). The electrical interconnects may be lands for an LGA package, pins for a pin array package, solder balls for a ball grid array package or other design. In this illustrative embodiment, the lid 380 may be a top hat design that includes a peripheral flange 390 that facilitates the clamping force applied by the force frame 90. Optionally, the lid 380 may be a bathtub or other type of configuration as desired. The lid 380 may be composed of well-known plastics, ceramics or metallic materials as desired. Some exemplary materials include nickel plated copper, anodized aluminum, aluminum-silicon-carbide, aluminum nitride, boron nitride or the like. In an exemplary embodiment, the lid 380 may consist of a copper core surrounded by a nickel jacket.

The socket housing 60 is a generally frame-like structure that is seated on the circuit board 20 and may include multiple projections and recesses that serve various functions that will be described in conjunction with subsequent figures. The socket housing 60 may include large numbers of conductive interconnects (not visible) that interface electrically with corresponding electrical interconnects of the circuit board substrate 370 of the packaged integrated circuit 30. The insulating portion of the socket housing 60 is advantageously fabricated from various insulating materials, such as, liquid crystal polymer, fiberglass resin materials, well-known plastics or the like. In an exemplary embodiment, the socket housing 60 and other polymer-based components disclosed herein, may be fabricated using well-known injection or other molding processes. The molding process may be thermoplastic, thermosetting or some other process. Vacuum conditions may be desirable to enhance structural uniformity. Optionally, machining or other well-known material shaping techniques could be used. The socket housing 60 may be secured to the circuit board 20 by plural solder balls (not visible). The solder balls are reflowed to not only secure the socket housing 60 but also to establish electrical connections with the circuit board 20. The socket housing 60 includes many conductor contacts (not visible) that make electrical connections between the package substrate 370 and the solder balls (not visible) beneath the socket housing 60. Of course, similar arrangements could be used for a pin grid array socket configuration.

The carrier frame 100 includes a central opening 400 designed to accommodate the lid 380 and includes various structures to facilitate the easy sliding engagement with the rail frame 80 as described in more detail below. The carrier frame 100 advantageously includes a handle 410 which is partially obscured by the force frame 90 but which is used to facilitate the user or machine manipulation of the combination of the carrier frame 100 and the packaged integrated circuit 30 for a variety of purposes to be described below. The carrier frame 100 may be advantageously fabricated from various insulating materials such as, for example, liquid crystal polymer, fiberglass resin materials, well-known plastics or the like. In an exemplary embodiment, the carrier frame 100 and other polymer-based components disclosed herein, may be fabricated using well-known molding processes. The molding process may be thermoplastic, thermosetting or some other process. Vacuum conditions may be desirable to enhance structural uniformity. Optionally, machining or other well-known material shaping techniques could be used.

The force frame 90 includes a central opening 420, which is designed to accommodate at least a portion of the lid 380 such that that portion can project upwardly through the opening 420 a small distance so that the heat sink 110 may be placed in thermal contact therewith. The force frame 90 includes load surfaces 430, two of which are visible in FIG. 1. The load surfaces 430 are designed to bear against the flange portion 390 of the lid 380 when the force frame 90 is clamped as described below. There are two other load surfaces, which are obscured by the heat sink 110, positioned opposite to the visible load surfaces 430. The force frame 90 also includes a tab 440, which facilitates the user or machine rotation of the force frame 90 in the A or B directions during the package insertion and extraction procedures to be described below. The end of the force frame 90 that includes the knuckles 310 has two spaced-apart fasteners 442, which may be screws, captive screws or other fasteners, that are designed to engage the threaded nuts 324 of the stiffener frame 40 when the force frame 90 is rotated down on or close to the packaged integrated circuit 30. There is another fastener at the tab 440 that is obscured by the heat sink 110, but which similarly engages another threaded nut (obscured by the socket housing 60) of the stiffener frame 40. Note that the threaded nuts 324 provide fixed hardware to facilitate the connection. The force frame 90 is advantageously constructed of material with sufficient stiffness to clamp the packaged integrated circuit 30 in place in the socket 10. Examples include stainless steel, copper, aluminum, nickel or other materials.

Figure 2:
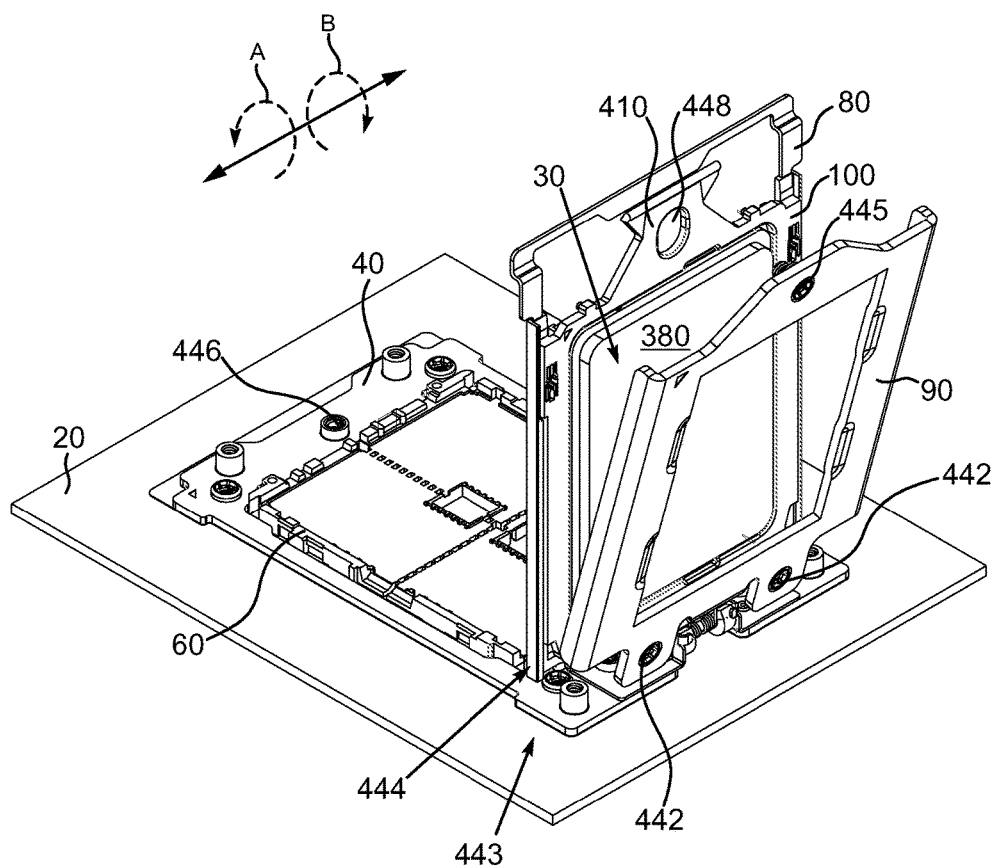
FIG. 2 is a pictorial view depicting an exemplary stiffener frame and socket housing of the exemplary socket mounted to the circuit board.

FIG. 2 is a pictorial view depicting the stiffener frame 40, and the socket housing 60 mounted to the circuit board 20. The rail frame 80 and the force frame 90 are pivotally-mounted to one end 443 of the stiffener frame 40 in the manner described above. In this regard, one end 444 of the rail frame 80 is pivotally connected to the stiffener frame 40. Here, the packaged integrated circuit 30 is mounted to the carrier frame 100, which is in-turn slidedly mounted on the rail frame 80. From the position shown in FIG. 2, the rail frame 80 may be rotated in direction A and ultimately moved into place into engagement with the socket housing 60 and thereafter the force frame 90 may be rotated similarly in direction A until the force frame 90 engages or is very close to the lid 380 of the packaged integrated circuit 30 and ultimately the fasteners 442 and an additional fastener 445 similar or identical to the fasteners 442 may threadedly engage the respective threaded nuts 324 (see FIG. 1) of the stiffener frame 40 as well as an additional threaded nut 446 of the stiffener frame 40. The depicted positions of the rail frame 80 and the force frame 90 may or may not represent their respective rotational limits in direction B. Note that the handle 410 of the carrier frame 100 includes an opening 448 to accommodate the threaded nut 446 when the rail frame 80 and the carrier frame 100 are rotated in direction A down into position.

Figure 3:
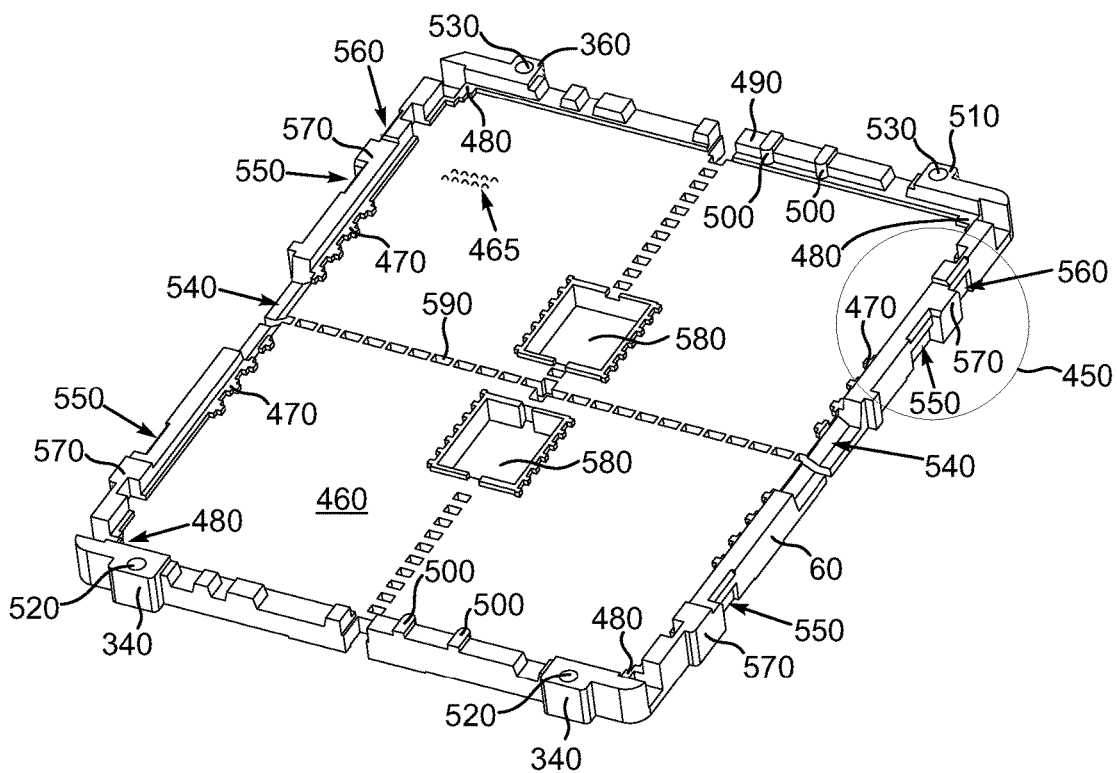
FIG. 3 is a pictorial view of an exemplary socket insulating housing.
Figure 4:
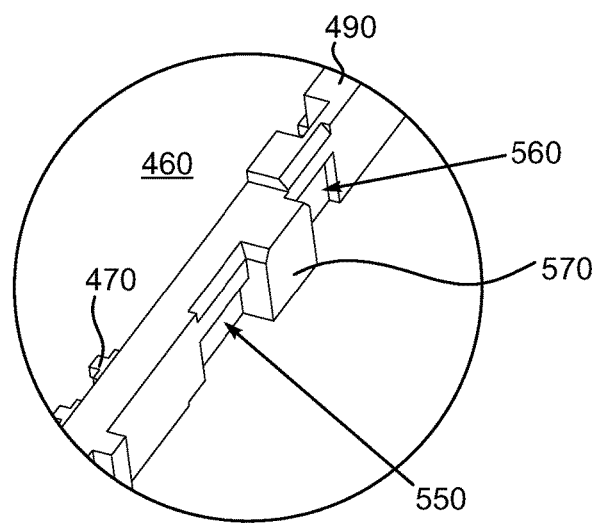
FIG. 4 is a portion of FIG. 3 shown at greater magnification.

Additional details of the socket housing 60 will now be described in conjunction with FIGS. 1, 3 and 4. FIG. 3 is a pictorial view of the socket housing 60 rotated to the right of the orientation depicted in FIG. 1 and shown alone without the other components. FIG. 4 is the portion of the socket housing 60 shown in FIG. 3 depicted at greater magnification. The socket housing 60 includes a floor 460 which, as noted above, may be populated with large numbers of electrical contacts 465 (only a few of which are visible) such as conductive contact elements for an LGA interface or pin holes in the event of pin grid array, etc. A seating plane to support the circuit board substrate 370 of the packaged integrated circuit 30 is provided by plural seating structures 470 along the various sides of the socket housing 60 and similar, albeit corner-positioned, seating structures 480 only three of which are visible. To ensure that the packaged integrated circuit 30 is mounted on the socket housing 60 in the proper orientation, a frame portion 490 of the socket housing 60 may include two or more keys 500, which are designed to engage corresponding slots in the packaged integrated circuit 30, which will be shown in subsequent figures. As noted above, the socket housing 60 includes keys 340 and 360 designed to engage respective notches 330 and 350 in the stiffener frame 40 depicted in FIG. 1. In addition, the socket housing 60 may include an additional key 510, which may be identical to the key 360 for engaging a notch (not shown) in the stiffener frame 40. Each of the keys 340 may include a pin bore 520 that is designed to receive an engagement pin of the carrier frame 100 that will be shown in a subsequent figure. The keys 360 and 510 similarly include respective pin holes 530 to receive engagement pins of the carrier frame 100 to be shown in subsequent figures. To provide easy finger access to the carrier frame 100 and packaged integrated circuit 30 when positioned in the socket housing 60, the frame portion 490 may be provided with opposing slots 540. The frame portion 490 may include undercut steps 550, which are designed to engage with small members, such as hooks, of an optional cover cap (not visible) that may be placed on the socket housing 60 prior to the insertion of an packaged integrated circuit 30 and carrier frame 100. In addition, the frame portion 490 may be provided with undercut steps 560 that are designed to engage with small members, such as hooks (not visible), of the rail frame 80 depicted in FIG. 1 when the rail frame 80 is rotated down and snapped in position. The frame portion 490 may also include polarization features 570 positioned around the perimeter of the frame portion 490. The polarization features are designed to prevent the rotation of stiffener frame 40 (see FIG. 1) relative to both the socket housing 60 and the circuit board 20 depicted in FIG. 1. This may be important in circumstances where the socket housing 60 is installed on the circuit board 20 prior to the installation of the stiffener frame 40. The socket housing 60 may include one or more windows 580 in the floor 460 that are designed to accommodate either components (not shown) of the circuit board 20 and/or components that are positioned on the underside of the package substrate 370. In addition, the floor 460 may include plural small windows 590 arranged in a column and an intersecting row that divides the floor 460 into quadrants. The windows 590 provide the socket housing with enhanced mechanical flexibility. This enhanced flexibility improves the planarity of the socket housing 60 during reflow of the underlying solder balls (not visible) to mount the socket housing 60 on the circuit board 20 shown in FIG. 1. Of course, arrangements other than the intersecting column and row may be used.

Figure 5:
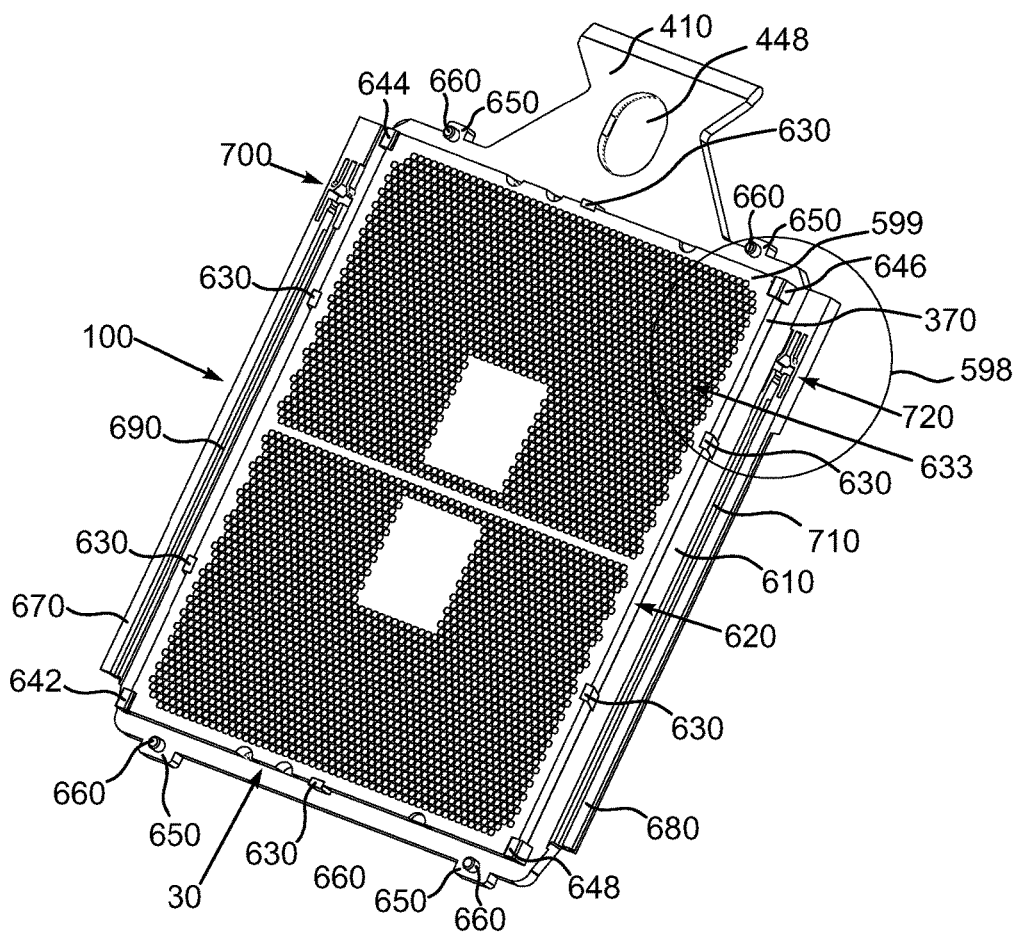
FIG. 5 is a pictorial view depicting an exemplary packaged integrated circuit mounted in an exemplary carrier frame.
Figure 6:
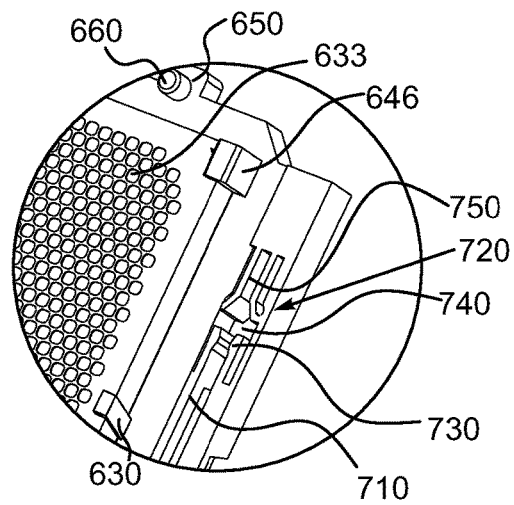
FIG. 6 is a portion of FIG. 5 shown at greater magnification.
Figure 7:
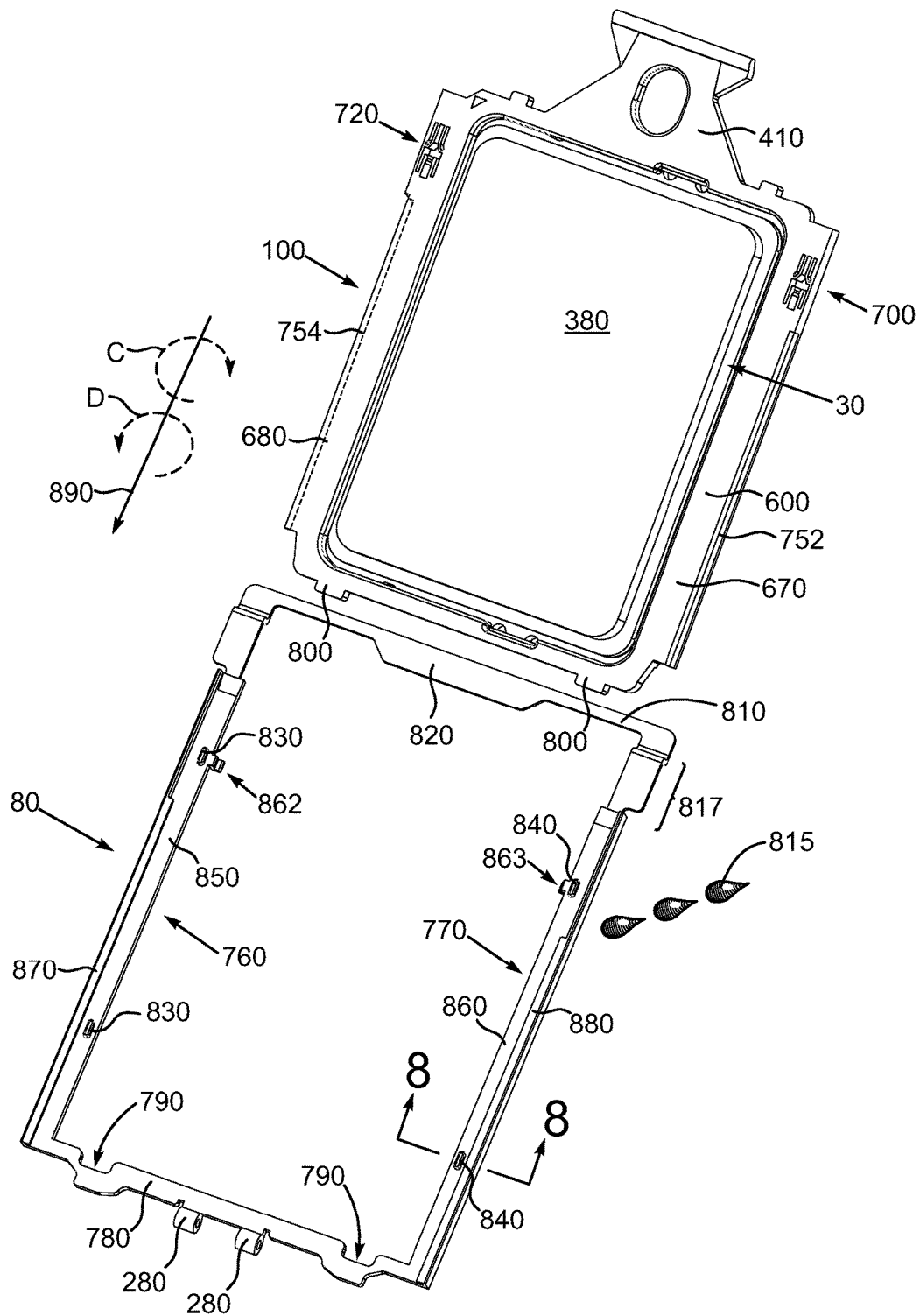
FIG. 7 is a pictorial view of an exemplary rail frame and a combined carrier frame the packaged integrated circuit exploded therefrom.

Additional details of the carrier frame 100 and the engagement thereof with the rail frame 80 and the packaged integrated circuit 30 may be understood by referring now to FIGS. 5, 6 and 7. FIG. 5 is a pictorial view that depicts the packaged integrated circuit 30 mounted on the carrier frame 100. FIG. 6 is the portion of FIG. 5 circumscribed by the circle 598 shown at greater magnification. FIG. 7 is a pictorial view that depicts the packaged integrated circuit 30 mounted to the carrier frame 100 and the combination of the packaged integrated circuit 30 and the carrier frame 100 shown exploded from the rail frame 80. Note that in FIG. 7 the lid 380 of the packaged integrated circuit 30 is visible while in FIG. 5 the carrier frame 100 is flipped over from the orientation in FIG. 7 so that the package substrate 370 and in particular the underside 599 thereof is visible but the lid 380 is obscured. The top side 600 of the carrier frame 100 is visible in FIG. 7 while the bottom side 610 of the carrier frame 100 is visible in FIGS. 5 and 6. The packaged integrated circuit 30 may be mounted to the carrier frame 100 by pushing the carrier frame 100 into the page and on to the package substrate 370 and/or vice versa until the edge 620 of the package substrate 370 shown in FIG. 5 engages and snaps beneath plural engagement tabs 630 which project slightly out of the page from the back side 610 of the carrier frame 100. In this illustrative embodiment, there may be six peripherally-spaced engagement tabs 630, however three or more may be sufficient to retain the package substrate 370 in position. The engagement tabs 630 may be fashioned as small hooks or other projections that have the ability to retain the package substrate 370, by friction or otherwise, in position relative to the carrier frame 100. Note that the visible side 599 of the embodiment of the package substrate 370 in FIGS. 5 and 6 includes plural conductive lands 633, which make conductive contact with conductive elements of the socket housing 60 shown in FIGS. 1 and 2. In other embodiments, the conductive lands 633 might be pins, solder structures or others.

The carrier frame 100 serves multiple functions related to the protection of the delicate interconnects (in this embodiment the conductive lands 633) of the package substrate 370 and the often delicate conductive structures 465 of the socket housing 60 shown in FIGS. 1 and 3. First, the carrier frame 100 serves as a convenient carrier for the packaged integrated circuit 30. It is desirable to avoid contacting the underside 599 during what may be multiple handling steps leading to the engagement or disengagement of the packaged integrated circuit 30 with the rail frame 80. The handle 410 provides this capability. The function of the opening 448 is disclosed above. Second, the carrier frame 100 along with the rail frame 80 removes any guesswork as to the proper and safe orientation of the package substrate 370 relative to the socket housing 60 (see FIG. 2). As described more fully below, the carrier frame 100 and the rail frame 80 cooperate to ensure that the packaged integrated circuit 30 may not be brought down on the socket housing 60 in the wrong orientation, i.e., with the lid 380 facing toward the socket housing 60. Such an improper orientation might damage the conductor structures of the socket housing 60.

In addition, and as shown in FIGS. 5 and 6, the carrier frame 100 may include small engagement members 642, 644, 646 and 648 which may be hooks or other structures and project outwardly from the page preferably slightly farther than the engagement tabs 630. The engagement hooks 642, 644, 646 and 648 are designed to snap into position and engage the overhangs 550 of the socket housing 60 shown in FIGS. 3 and 4 when the combination of the rail frame 80 and the carrier frame 100 are rotated and snapped into position. The carrier frame 100 may include small tabs 650 which include respectively outwardly projecting pins 660. The pins 660 are designed to insert into the respective pin holes 520 of the frame portion 490 of the socket housing 60 shown in FIG. 3 when the rail frame 80 and the carrier frame 100 are rotated and snapped into position. The carrier frame 100 includes a flange 670 and an oppositely-positioned flange 680. The flange 670 includes a longitudinal slot 690 that has at one end a locking mechanism 700. The flange 680 similarly includes a longitudinal slot 710 that also has at one end a locking mechanism 720. The locking mechanism 720 includes a flexible fork mechanism 730 at the termination of the longitudinal slot 710. Across a gap 740 from the fork mechanism 730 is a tapered slot 750. The locking mechanism 700 has the same structures. As better seen in FIG. 7, the flange 670 of the carrier frame 100 includes a second or sub-flange 752 and the flange 680 similarly includes a second or sub-flange 754 (shown in phantom due to the orientation of the carrier frame 100 in FIG. 7). The sub-flanges 752 and 754 are designed to engage features of the rail frame 80 to be described below.

Referring now to FIG. 7, the rail frame 80 includes spaced-apart rail members 760 and 770. The rail members 760 and 770 are connected at one end by a frame member 780, which may be coupled to or integrally formed with the rail members 760 and 770. The frame member 780 includes the knuckles 280 depicted in FIG. 1 and described above. The frame member 780 additionally includes respective notches 790 that are designed to accommodate the keys 340 of the socket housing 60 depicted in FIGS. 1 and 3. In addition, the notches 790 may engage with respective tabs 800 of the carrier frame 100 to prevent relative motion between the two structures. The rail members 760 and 770 may be connected at the other end by way of a cross member 810, which may be coupled to or integrally formed with the rail members 760 and 770. The rail frame may be fabricated from a variety of materials, such as stainless steel, copper, aluminum, nickel or other materials. Well-known fabrication techniques may be used to construct the rail frame 80, such as stamping, machining, casting or others. It may be desirable to coat the frame member 780 and the rail members 760 and 770 with an insulating material 815, such as liquid crystal polymer, well-known plastics or the like while leaving the cross member 810 and respective portions 817 of the rail members 760 and 770 uncoated. This polymer coating 815 may be placed by injection molding or other techniques. The cross member 810 includes a movement tab 820, both of which are offset into the page from the rail members 760 and 770. The cross member 810 and the movement tab 820 serve several functions. First, the cross member 810 and movement tab 820 enable the user to easily depress the rail frame 80 and rotate it in direction A as shown in FIG. 1. The movement tab 820 is centrally located relative to the rail members 760 and 770. Thus, when the force is applied to the movement tab 820 to rotate the rail frame 80, very little torque is applied to the rail frame 80 in either direction C or direction D shown in FIG. 7. This reduces the chances that the packaged integrated circuit 30 will not be level relative to the socket housing 60 (see FIG. 1) during pivoting movements. In addition, the spatial offset between the cross member 810, and particularly the movement tab 820, relative to the rail members 760 and 770 provides a stop against inadvertently positioning a carrier frame 100 into the rail frame 80 in the improper orientation. Finally, the cross member 810 stabilizes the rail members 760 and 770, which might otherwise undergo torsional displacements. As shown in FIG. 7, the rail member 760 includes an engagement member 862, in the form of the depicted hook or other member, that projects into the page away from the rail member 760. The rail member 770 similarly includes an engagement member 863 positioned opposite to the engagement tab 862. The engagement members 862 and 863 snap into engagement with the overhangs 560 of the socket housing 60 (see FIGS. 3 and 4) when the rail frame 80 is rotated down into the engagement with the socket housing 60. It may be possible to use one or more of the engagement members 862 and/or 863.

Figure 8:
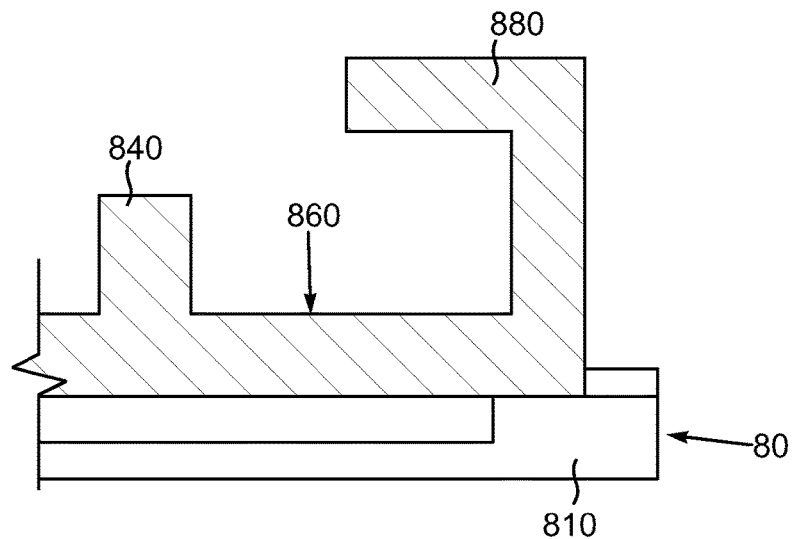
FIG. 8 is a sectional view of FIG. 7 taken at section 8-8.
Figure 9:
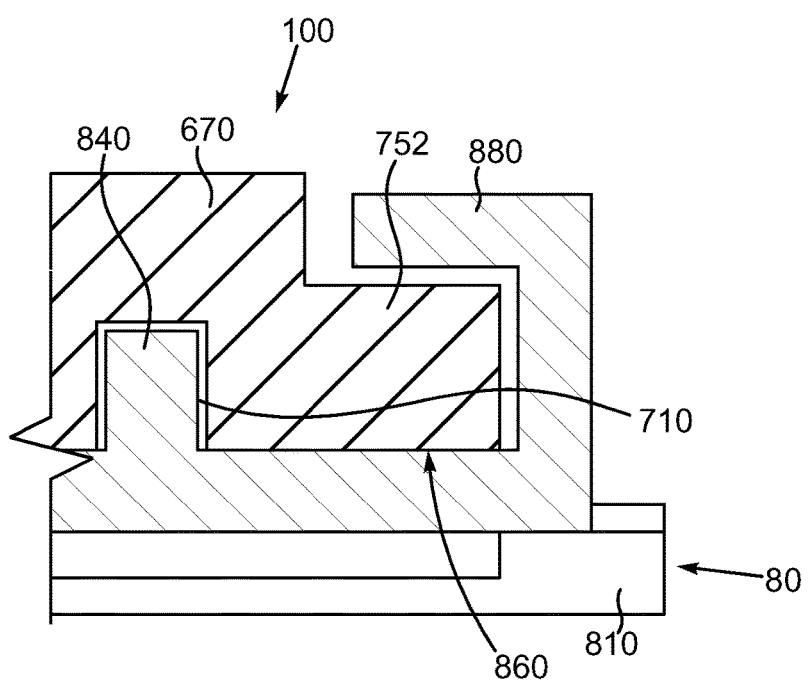
FIG. 9 is a sectional view like FIG. 8, but depicting placement of the carrier frame.
Figure 10:
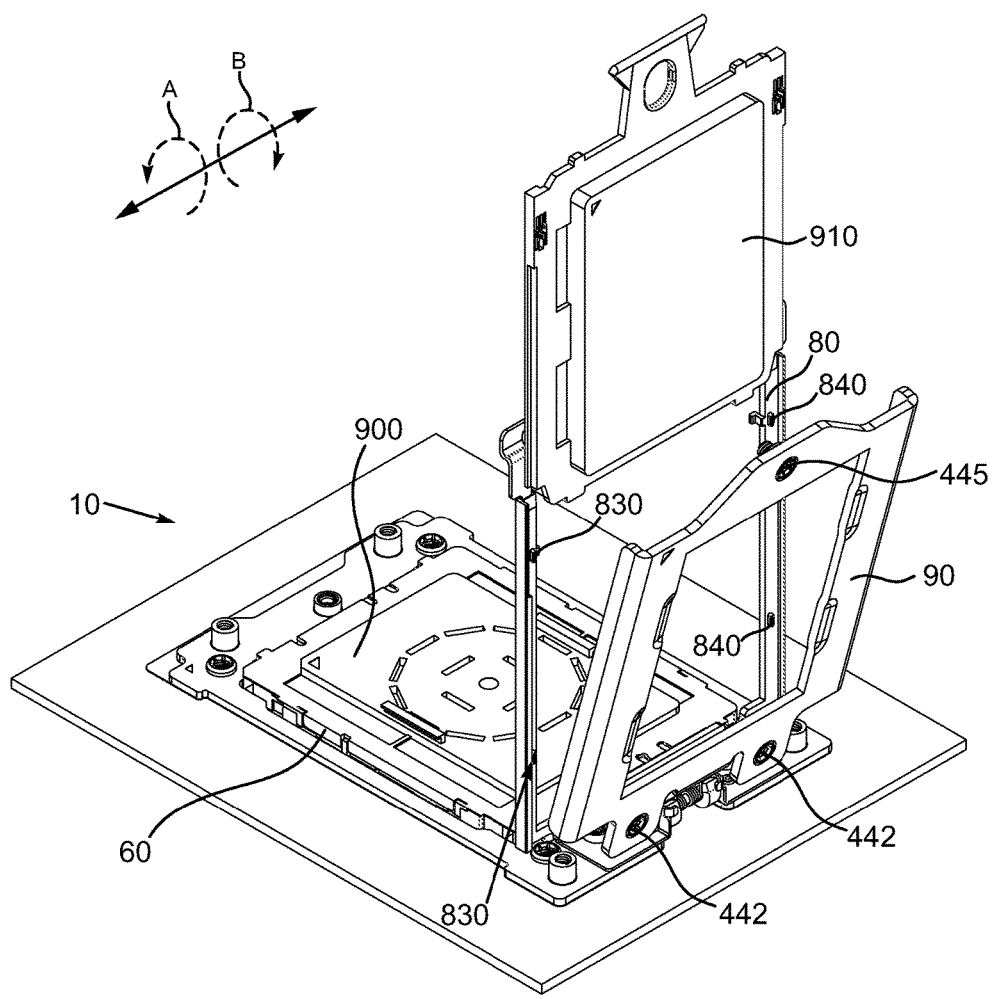
FIG. 10 is a pictorial view depicting exemplary removal of an exemplary optional external cap.

Still referring to FIG. 7, the rail member 760 may include one or more longitudinally spaced-apart keys 830. The rail member 770 similarly includes one or more longitudinally spaced-apart keys 840. The keys 830 and 840 project out of the page relative to seating surfaces 850 and 860 of the rail members 760 and 770 respectively. The rail member 760 includes a channel 870 and the rail member 770 includes a channel 880. The structure of the channel 880 may be better understood by referring now also to FIG. 8, which is a sectional view of FIG. 7 taken at section 8-8. When the carrier frame 100 is in the orientation depicted in FIG. 7 and slid in the direction of the arrow 890, the flange 670 engages the surface 850 of the rail member 760 and the flange 670 engages the surface 860 of the rail member 770. The movement of the carrier frame 100 an additional distance in the direction of the arrow 890 continues until the slot 710 of the carrier frame 100 slides over the keys 830 and the slot 690 slides over the keys 840. At some point, the sub-flange 752 will slide underneath and be restrained spatially by the channel 880 as best seen in FIG. 9, which is a sectional view like FIG. 8 but depicting the placement of the flange 670 of the carrier frame 100. The sub-flange 764 similarly engages the channel 870 shown in FIG. 7. Note that in FIG. 9, one of the keys 840 is shown positioned inside the slot 710 and also that the flange 670 is seated on the seating surface 860. The carrier frame 100 is advanced along the direction of arrow 890 until the keys 830 and 840 engage the respective locking mechanisms 720 and 700. Referring again to FIG. 6, this action involves the movement of, for example, the key 840 past the flexible fork member 730 until the fork member 730 is passed and snaps back into position at which point the key 840 will be positioned partially in the gap 740 and partially in the tapered slot 750. The various engagement members 862 and 863 and the keys 830 and 840 may be composed of the molded polymer material 815 or be constructed of metal that is subsequently coated with the polymer 815. It should be noted that in some embodiments, the package substrate 370 could be inserted in the rail frame 80 using the channels 870 and 880 without using the carrier frame 100. These alternatives might eliminate the need for the keys 830 and 840.

Figure 11:
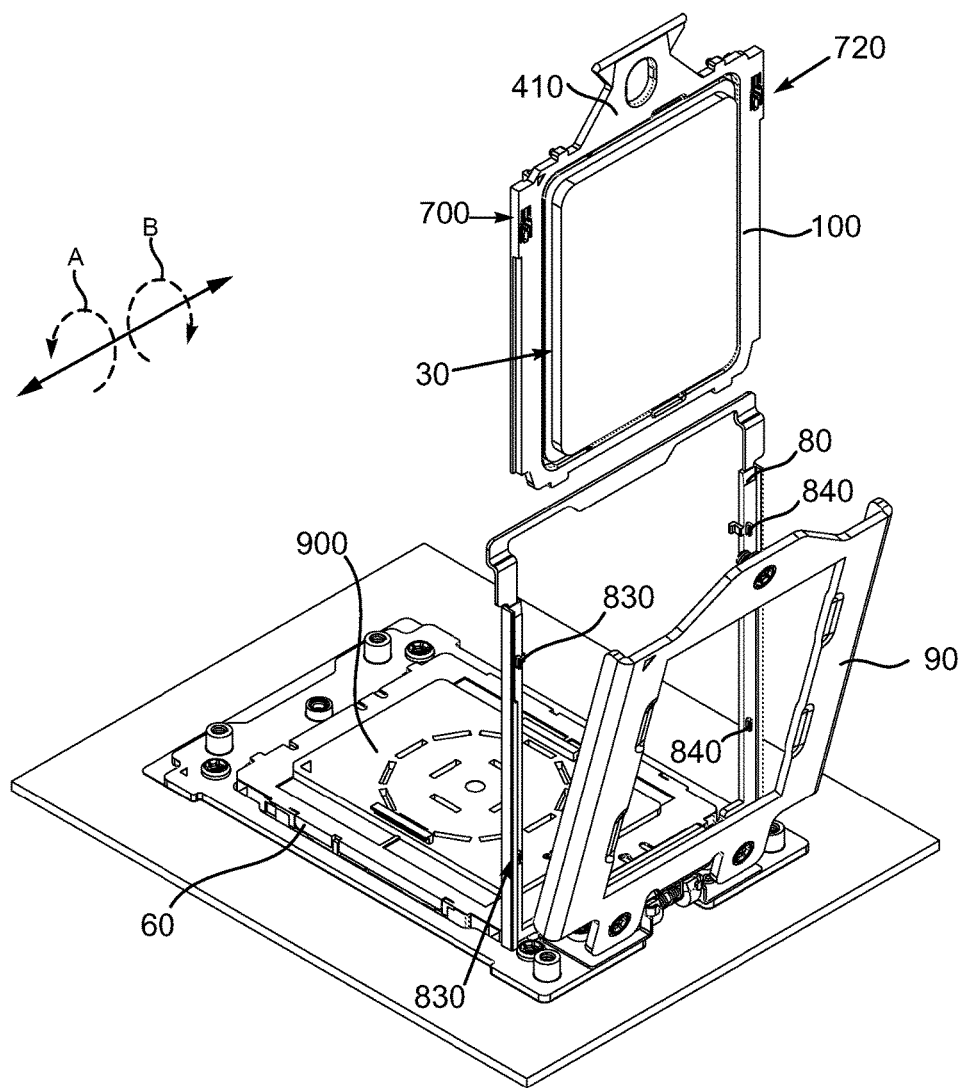
FIG. 11 is a pictorial view like FIG. 10, but depicting exemplary insertion of a carrier frame and packaged integrated circuit on a rail frame.

The insertion of the combination of the carrier frame 100 and the packaged integrated circuit 30 into the socket 10 will be described now in conjunction with FIGS. 10, 11, 12, 13, 14, 15 and 16. Attention is initially turned to FIG. 10, which is a pictorial view of the circuit board 20 and the socket 10 mounted thereto. Here, the socket 10 is depicted prior to the mounting thereon of the carrier frame 100 and packaged integrated circuit 30 depicted in other figures. Instead, and at this preliminary stage, the socket housing 60 may be fitted with a cover cap 900 that may have a footprint that substantially matches the footprint of the socket housing 60 and is advantageously fabricated from insulating materials such as, liquid crystal polymer, fiberglass resin materials, well-known plastics or the like. The purpose of the cover cap 900 is to protect the delicate conductor structures (465 shown in FIG. 3) and other structures (not visible) of the socket housing 60 at those points in time prior to the installation of the packaged integrated circuit 30 and the carrier frame 100. Additional structural protections may be provided to the socket housing 60 by inserting an external cap 910 in the rail frame 80 and locking the external cap 910 and the rail frame 80 into position as if the external cap were the packaged integrated circuit 30 and carrier frame 100 combination. The external cap 910 may be constructed of some insulating materials such as liquid crystal polymer, fiberglass resin materials, well-known plastics or the like and temporarily placed in the rail frame 80 using the same structural features and techniques described above in conjunction with the placement of the carrier frame 100 and the packaged integrated circuit 30. Thus, the external cap 910 may include the aforementioned slots and locking mechanisms associated with the carrier frame 100 and that interact with the keys 830 and 840 of the rail frame 80 as described above. Here in FIG. 10, the external cap 910 is shown being removed from the rail frame 80 after the rail frame 80 has been rotated in direction B and of course after the force frame 90 has been disconnected from the stiffener frame 40 by loosening the fasteners 442 and 445. With the external cap 910 removed from the rail frame 80, and with the rail frame 80 and the force frame 90 in the positions shown, the carrier frame 100 and the packaged integrated circuit 30 may be slidedly mounted on the rail frame 80 and snapped into position as shown in FIG. 11. This operation may be conducted while the cover cap 900 remains in place to protect the delicate structures of the socket housing 60. Again, the carrier frame 100 may be advanced on the rail frame 80 using the handle 410 as described above in conjunction with FIGS. 7, 8 and 9 such that the keys 830 and 840 engage the slots 690 and 710 shown in FIG. 5 of the carrier frame 100 until the locking mechanisms 700 and 720 engage the topmost keys 830 and 840 shown in FIG. 11. The force frame 90 is spring-biased in direction B to maintain clearance to manipulate the packaged integrated circuit 30 and the carrier frame 100.

Figure 12:
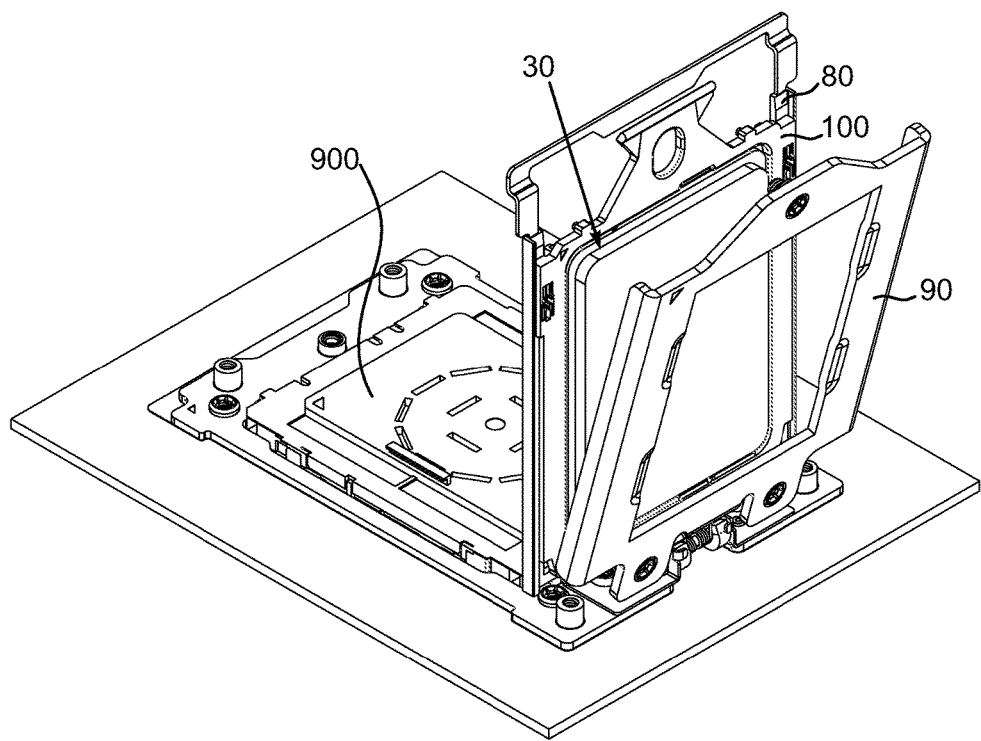
FIG. 12 is a pictorial view like FIG. 11, but depicting the carrier frame and packaged integrated circuit mounted on the rail frame.
Figure 13:
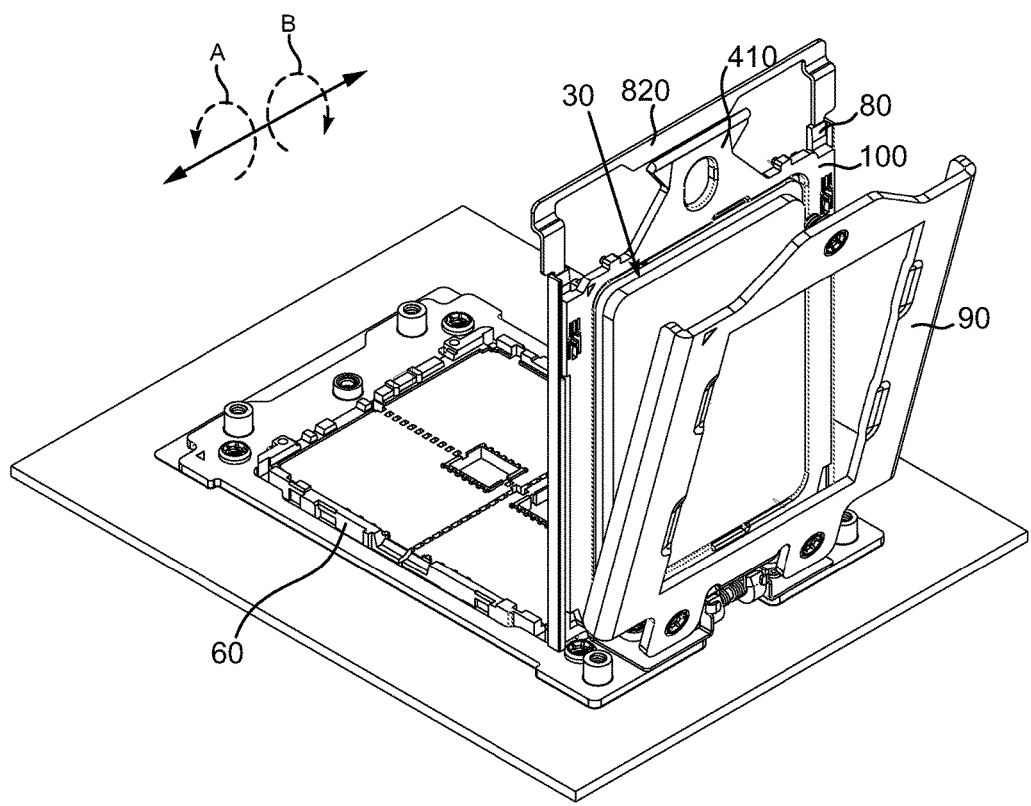
FIG. 13 is a pictorial view like FIG. 12, but depicting removal of an exemplary optional cover cap.
Figure 14:
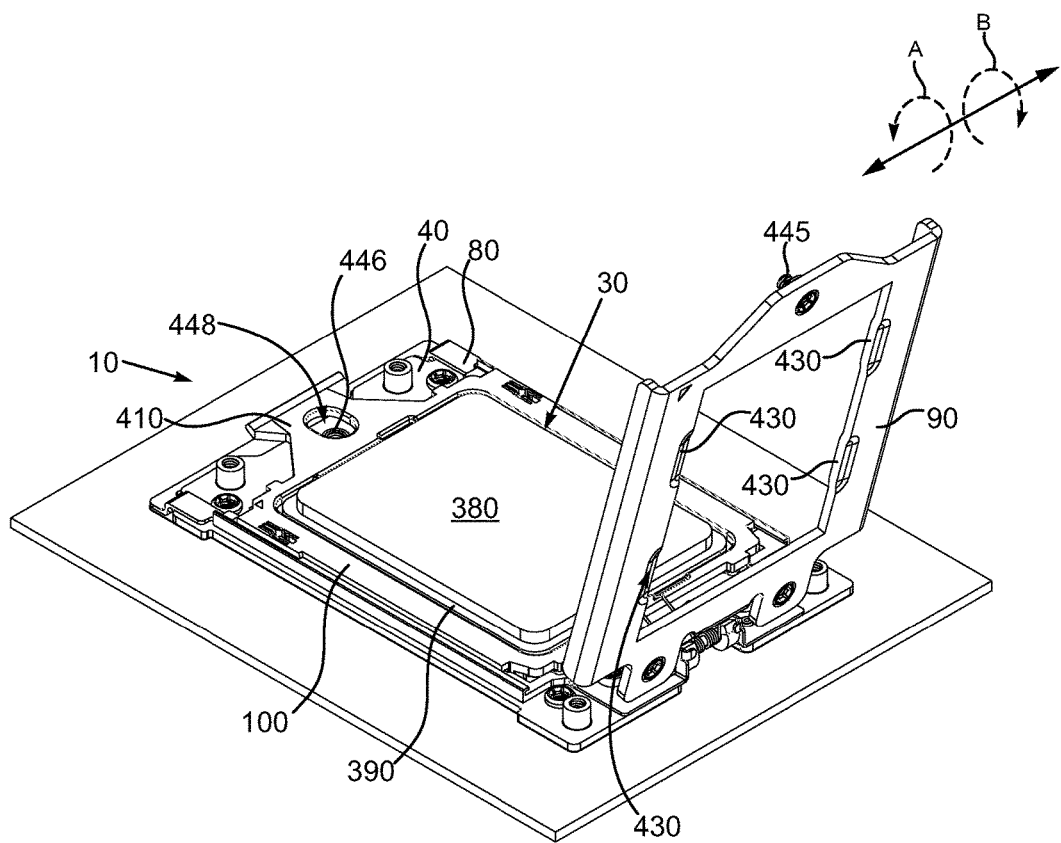
FIG. 14 is a pictorial view like FIG. 13, but depicting pivoting of the rail frame into engagement with the insulating housing.
Figure 15:
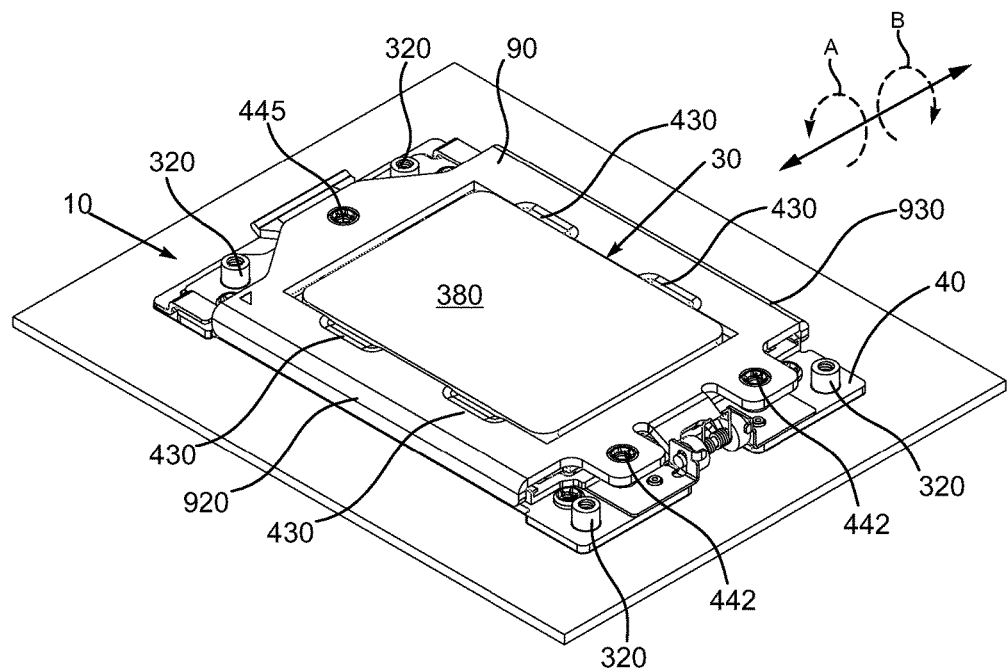
FIG. 15 is a pictorial view like FIG. 14, but depicting pivoting of the force frame into engagement with the stiffener frame and packaged integrated circuit.

FIG. 12 depicts the locked-in position of the carrier frame 100 and packaged integrated circuit 30 relative to the rail frame 80. Again, the cover cap 900 may be maintained in position during this insertion procedure and the force frame 90 is held in position out of the way. Next and as shown in FIG. 13, the cover cap 900 depicted in FIG. 12 may be removed from the socket housing 60. At this point, the rail frame 80 with the carrier frame 100 and packaged integrated circuit 30 secured thereto is ready to rotate in direction A to snap into position relative to the socket housing 60. Force may be applied to the movement tab 820 of the rail frame 80 and/or the handle 410 of the carrier frame 100. The force frame 90 may remain in the position depicted in FIG. 13 during this pivoting maneuver. Next and as shown in FIG. 14, the rail frame 80, the carrier frame 100 and the packaged integrated circuit 30 may be rotated in direction A until the rail frame 80 snaps into position relative to the socket housing 60. In FIG. 14, the socket housing 60 is obscured by the carrier frame 100. However, this locking of the carrier frame 100 and the rail frame 80 relative to the socket housing 60 involves the snapping engagement of the downwardly projecting engagement members 862 and 863 of the rail frame 80 shown in FIG. 7 with the overhangs 560 of the socket housing 60 shown in FIG. 3. This pivoting movement in direction A may be accomplished by hand or otherwise manipulation of either the movement tab portion 820 of the rail frame 80 or the handle 410 of the carrier frame 100. Note that at this point, the opening 448 in the handle 410 allows the eventual engagement of the fastener 445 with the threaded nut 446 of the stiffener frame 40 when the force frame 90 is next pivoted in direction A. Referring now to FIGS. 14 and 15, the force frame 90 may be rotated in direction A until the load members 430 of the force frame 90 engage the flange 390 of the package lid 380. At this point, the fasteners 442 and 445 may be tightened to some selected level of tightness to ensure that the packaged integrated circuit 30 electrically interfaces correctly with the socket 10. Note that the force frame 90 includes downwardly projecting side flanges 920 and 930 that prevent the force frame 90 from lateral movement relative to the socket housing and stiffener frame 40, also protect the sides of the socket housing 60 (again not visible in FIG. 15) and make the force frame 90 structurally stronger. To remove the packaged integrated circuit 30, the foregoing steps merely need to be reversed. At this point, the heat sink 110 shown in FIG. 1 may be secured to the stiffener frame 40 by way of the threaded nuts 320. The upper surface of the lid 380 of the packaged integrated circuit 30 advantageously projects a small distance (in an exemplary embodiment about 20 to 200 microns and preferably about 50 microns) above the upper surface of the force frame 90. Thus, the heat sink 110 need not utilize a pedestal to make thermal contact with the lid 380.

Figure 16:
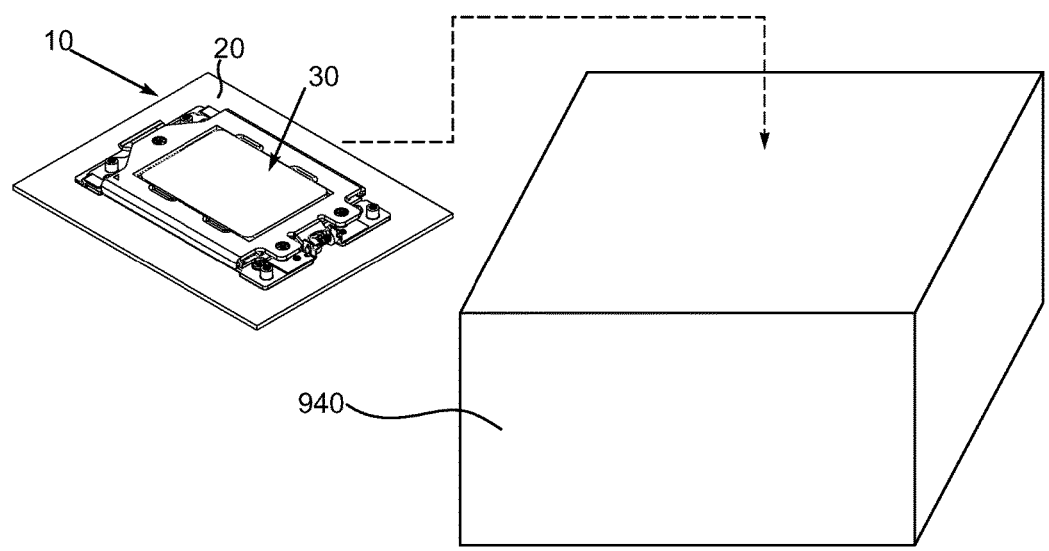
FIG. 16 is a schematic depiction of the insertion of the circuit board and socket into an electronic device.

As shown in FIG. 16, the circuit board 20 and socket 10, with or without the packaged integrated circuit 30, may be mounted in a computing device 940. The computing device 940 may be a computer, a server, a communications device, a multi-media device or virtually another type of computing device.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An apparatus for electrically connecting a packaged integrated circuit having an upper surface to a circuit board, comprising:
  a first frame adapted to be mounted on the circuit board and having a first end;
  a socket housing adapted to be mounted on the circuit board and positioned in the first frame, the socket housing including plural electrical contacts to electrically interface with the packaged integrated circuit;
  a second frame having a first end pivotally coupled to the first end of the first frame, the second frame including two spaced-apart rail members and a cross member coupled to and between the rail members opposite the first end of the second frame, the rail members being operable to receive a carrier frame capable of holding the packaged integrated circuit, the second frame having at least one engagement member to engage a first portion of the socket housing and lock the second frame relative to the socket housing when the second frame is pivoted toward the socket housing; and
  a third frame having an upper surface and a first end pivotally coupled to the first end of the first frame and being operable to apply force to and clamp the packaged integrated circuit in a position wherein the upper surface of the packaged integrated circuit projects above the upper surface of the third frame.

2. The apparatus of claim 1, wherein the each of the rail members has at least one of the engagement members.

3. The apparatus of claim 1, wherein the carrier frame includes spaced-apart flanges to slidedly engage the rail members, the flanges each having a longitudinal slot, the rail members each including at least one key for one of the longitudinal slots to travel over when the carrier frame is slid on the rail members.

4. The apparatus of claim 1, wherein the socket housing includes upwardly facing bores to receive downwardly projecting pins of the carrier frame.

5. The apparatus of claim 1, wherein the rail members comprise a polymer coating.

6. The apparatus of claim 1, wherein the socket housing includes a second portion and the carrier frame includes at least one engagement member to engage the second portion when the second frame and the carrier frame are pivoted toward the socket housing.

7. The apparatus of claim 1, wherein the first frame includes fixed hardware components and the third frame includes fasteners to make threaded connections to the fixed hardware components.

8. The apparatus of claim 1, wherein the socket housing includes a floor and a frame portion, the floor including plural windows that enhance the flexibility of the socket housing.

9. An apparatus, comprising:
  a circuit board;
  a first frame mounted on the circuit board and having a first end;
  a socket housing mounted on the circuit board and positioned in the first frame, the socket housing including plural electrical contacts to electrically interface a packaged integrated circuit having an upper surface;
  a second frame having a first end pivotally coupled to the first end of the first frame, the second frame including two spaced-apart rail members and a cross member coupled to and between the rail members opposite the first end of the second frame, the rail members being operable to receive a carrier frame capable of holding the packaged integrated circuit, the second frame having at least one engagement member to engage a first portion of the socket housing and lock the second frame relative to the socket housing when the second frame is pivoted toward the socket housing; and
  a third frame having an upper surface and a first end pivotally coupled to the first end of the first frame and being operable to apply force to and clamp the packaged integrated circuit in a position wherein the upper surface of the packaged integrated circuit projects above the upper surface of the third frame.

10. The apparatus of claim 9, comprising an electronic device, the circuit board being mounted in the electronic device.

11. The apparatus of claim 9, wherein the each of the rail members has at least one of the engagement members.

12. The apparatus of claim 9, wherein the carrier frame includes spaced-apart flanges to slidedly engage the rail members, the flanges each having a longitudinal slot, the rail members each including at least one key for one of the longitudinal slots to travel over when the carrier frame is slid on the rail members.

13. The apparatus of claim 9, wherein the socket housing includes upwardly facing bores to receive downwardly projecting pins of the carrier frame.

14. The apparatus of claim 9, wherein the rail members comprise a polymer coating.

15. The apparatus of claim 9, wherein the socket housing includes a second portion and the carrier frame includes at least one engagement member to engage the second portion when the second frame and the carrier frame are pivoted toward the socket housing.

16. The apparatus of claim 9, wherein the first frame includes fixed hardware components and the third frame includes fasteners to make threaded connections to the fixed hardware components.

17. The apparatus of claim 9, wherein the socket housing includes a floor and a frame portion, the floor including plural windows that enhance the flexibility of the socket housing.

18. A method of mounting a packaged integrated circuit having an upper surface on a circuit board, comprising:

placing the packaged integrated circuit on a carrier frame;

placing the carrier frame and the packaged integrated circuit on a first frame, the first frame having a first end pivotally coupled to a first end of a second frame coupled to the circuit board, the first frame including two spaced-apart rail members and a cross member coupled to and between the rail members opposite the first end of the first frame, the rail members being operable to receive the carrier frame, the first frame having at least one engagement member to engage a first portion of a socket housing mounted on the circuit board when the first frame is pivoted toward the socket housing, the socket housing including plural electrical contacts to electrically interface with the packaged integrated circuit;

pivoting the first frame toward the socket housing until the at least one engagement member engages the first portion of the socket housing and locks the second frame relative to the socket housing; and clamping the packaged integrated circuit against the socket housing by pivoting a third frame pivotally coupled to the first end of the second frame into engagement with the packaged integrated circuit, wherein the upper surface of the packaged integrated circuit projects above an upper surface of the third frame.

19. The method of claim 18, wherein the each of the rail members has at least one of the engagement members, the method comprising engaging the first portion and a second portion of the socket housing with the engagement members.

20. The method of claim 18, wherein the carrier frame includes spaced-apart flanges to slidedly engage the rail members, the flanges each having a longitudinal slot, the rail members each including at least one key for one of the longitudinal slots to travel over when the carrier frame is slid on the rail members.

* * * * *